United States Patent [19]

Kawakita et al.

[11] Patent Number: 4,615,746

[45] Date of Patent: Oct. 7, 1986

[54] METHOD OF FORMING ISOLATED ISLAND REGIONS IN A SEMICONDUCTOR SUBSTRATE BY SELECTIVE ETCHING AND OXIDATION AND DEVICES FORMED THEREFROM

[76] Inventors: Kenji Kawakita, 21-1-E14-103, Korigaoka-1-chome, Hirakata-shi; Hiroyuki Sakai, 12, Babacho-3-chome, Moriguchi-shi; Toyoki Takemoto, 9-3, Nishiyamamarou, Yamata-shi, all of Japan

[21] Appl. No.: 652,096

[22] Filed: Sep. 19, 1984

[30] Foreign Application Priority Data

Sep. 29, 1983 [JP] Japan ................. 58-182106
Sep. 29, 1983 [JP] Japan ................. 58-182121

[51] Int. Cl.⁴ .................. H01L 21/225; H01L 21/302
[52] U.S. Cl. .................. 148/1.5; 29/576 B; 29/576 W; 29/578; 148/175; 148/187; 357/51
[58] Field of Search .................. 148/1.5, 187, 175; 29/576 B, 578, 576 W; 357/51

[56] References Cited

U.S. PATENT DOCUMENTS 3,966,501  6/1976  Nomura et al. ............ 148/1.5
4,101,350  7/1978  Possley et al. ............ 148/175
4,196,440  4/1980  Anantha et al. .......... 357/35
4,329,772  5/1982  Oikawa et al. ............ 148/1.5
4,403,396  9/1983  Stein ........................ 29/571
4,449,285  5/1984  Janes et al. ............... 29/571
4,497,108  2/1985  Kurusowa ................. 29/571
4,505,025  3/1985  Kurusowa et al. ........ 29/576 W
4,506,434  3/1985  Ogawa et al. ............. 148/1.5

FOREIGN PATENT DOCUMENTS 8346  1/1984  Japan .

OTHER PUBLICATIONS

Ning et al, IBM-TDB, 26 (Apr. 1984), 5858.

Primary Examiner—Upendra Roy

[57] ABSTRACT

A method of fabricating a semiconductor device comprises the steps of forming oxidation-resistive films on the surface and sides of a protrusion formed on a semiconductor substrate, forming grooves at the bottom of the sides of the protrusion, forming highly doped impurity diffusion regions in the groove surfaces, and subjecting the grooves to selective oxidation to form an oxide film under the bottom of the protrusion while a highly doped impurity diffusion region is formed, and forming a device in the protrusion.

12 Claims, 12 Drawing Figures

METHOD OF FORMING ISOLATED ISLAND REGIONS IN A SEMICONDUCTOR SUBSTRATE BY SELECTIVE ETCHING AND OXIDATION AND DEVICES FORMED THEREFROM

BACKGROUND OF THE INVENTION

1. Field of the Invention

This invention relates to a method of fabricating a semiconductor integrated circuit device having high density and suitable for high speed operation.

2. Description of the Prior Art

Semiconductor integrated circuits show promise as devices which can provide high density, high speed and low power consumption. However, there is one problem which must be overcome before these advantages can be effectively implemented. It is a parasitic capacitance. Its reduction may permit a higher-speed lower-power-consumption device to be manufactured. Thus, many attempts have been made to reduce parasitic capacitance.

One example is a method whereby monocrystalline insulating substrate, e.g., sapphire is employed to effect vapor growth of silicon thereon. This substrate is normally called a SOS (Silicon On Sapphire).

FIGS. 1a to 1d show the steps employed in carrying out this method. In FIG. 1a, a silicon layer is grown on a sapphire substrate 1 by a vapor growth method and then an n-type impurity is diffused thereinto, which changes the silicon layer into an n+ layer 2. Next, as shown in FIG. 1b, a silicon oxide film 4 and a silicon nitride film 5 are formed on the area which is to be an island region of the n-type region 3 and thereafter the n-type region 3 is etched in the direction of depth. Then, as shown in FIG. 1c, a selective oxidation is performed using the silicon nitride film 5 as a mask thereby to form a silicon oxide film 6 the bottom of which reaches the sapphire substrate 1, and thereafter the silicon oxide film 4 and silicon nitride 5 are removed. Finally, as shown in FIG. 1d, a base region 7 and emitter region 8 are diffused into the n-type island region 3 which is surrounded by the sapphire substrate 1 at its bottom and by the silicon oxide film 6 at its side, and thereafter an emitter electrode 9, a base electrode 10 and a collector electrode 11 are formed in ohmic contact with the emitter region 8, the base region 7 and the n+ type layer 2, thereby obtaining an npn bipolar transistor.

The device fabricated by the method described above possesses the excellent feature of low parasitic capacitance which is attributable to the complete separation of the island region by an insulator, but also possesses the following defects:

(1) It is expensive since monocrystalline sapphire is used as a substrate.

(2) A heat treatment at high temperature during the fabrication process of the device evaporates or diffuses alumina ($Al_2O_3$) from the sapphire substrate, which contaminates an electric furnace, etc.

Due to these two defects, the above device has not been widely used.

Japanese Patent Application Kokai (Laid-Open) No. 8346/84 specification discloses another method of completely separating a device area by an insulator. In this method, an n+ buried region below a monocrystalline silicon layer is subjected to anisotropic etching, and then the n+ type region thus left beneath the monocrystalline silicon layer is oxidized to completely separate the monocrystalline silicon region by the thus formed oxide film. This monocrystalline silicon layer is made of an epitaxial layer which is grown on a monocrystalline silicon substrate having the n+ buried region on its surface.

SUMMARY OF THE INVENTION

Accordingly, an object of this invention is to provide a method of fabricating a semiconductor device in which both parasitic resistance and parasitic capacitance are reduced by forming an oxide film on the bottom area of a device area and a heavily doped impurity region is simultaneously formed on an entire bottom area of a device area.

DESCRIPTION OF THE PREFERRED EMBODIMENTS

FIGS. 2a to 2f show sectional views of the steps employed in fabricating one embodiment of this invention.

Figure 1A:
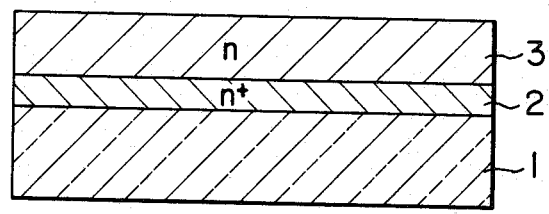
FIGS. 1a to 1d show sectional views of the steps employed in fabricating a conventional bipolar transistor using an SOS substrate.
Figure 1B:
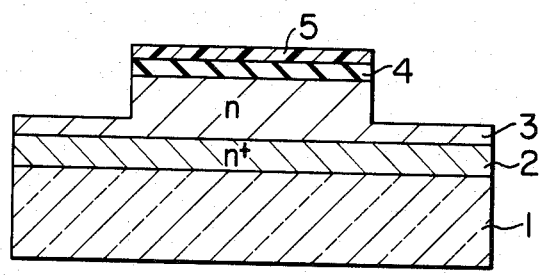
Figure 1C:
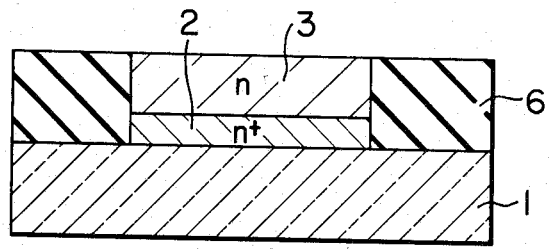
Figure 1D:
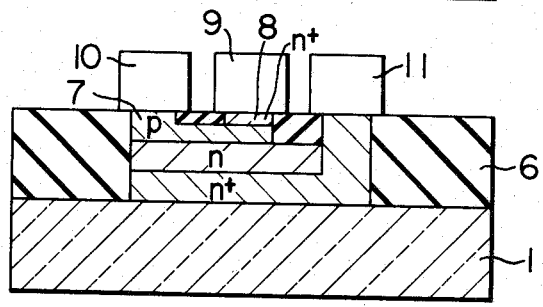
Figure 2A:
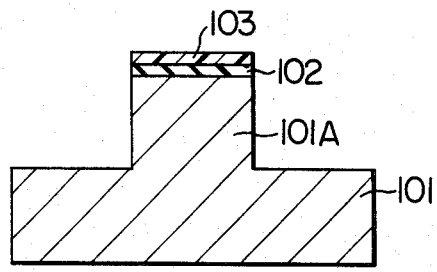
FIGS. 2a and 2f show sectional views of the steps employed in fabricating a bipolar transistor according to one embodiment of this invention.

First, as seen from FIG. 2a, a silicon oxide film 102 having a thickness of 500-1000 Å is formed on an n-type silicon substrate 101 by thermal oxidation and thereafter a silicon nitride film 103 having a thickness of about 1000-1500 Å is formed on the silicon oxide film 102 by a low-pressure CVD method. This silicon nitride film 103 is employed as a mask for selective oxidation and the silicon oxide film 102 acts as a buffer film for stress applied to the substrate during the selective oxidation. The silicon nitride film 103 and the silicon oxide film 102 are plasma-etched away by $CF_4$ gas, for example, by using a resist patterned on a device region as a mask. Subsequently, the silicon substrate 101 is reactive-ion-etched vertically using $CCl_2F_2$ gas, for example, thereby to form a protrusion 101 A. The protrusion 101 A extends from a base portion of the silicon substrate 101.

Figure 2D:
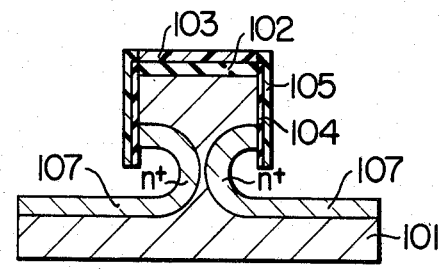
Figure 2B:
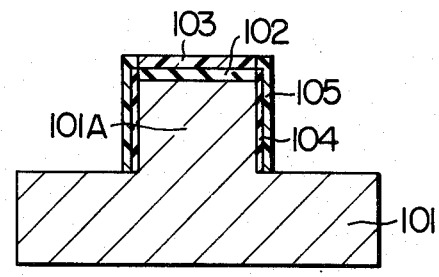

Next, as seen from FIG. 2b, the silicon substrate 101 is subjected to thermal oxidation to form silicon oxide films 104 having a thickness of 500-1000 Å and thereafter second silicon nitride films 105 having a thickness of 1000-1500 Å are formed on the entire resultant surface by a low-pressure CVD method. Thereafter, the silicon nitride films 105 are anisotropically etched through a reactive ion etching method by using $CCl_2F_2$ gas for example to leave the silicon nitride films 105 on only the sides of the protrusion 101 A.

Figure 2E:
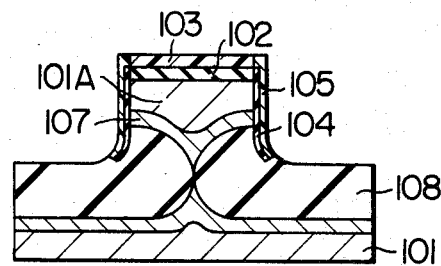
Figure 2C:
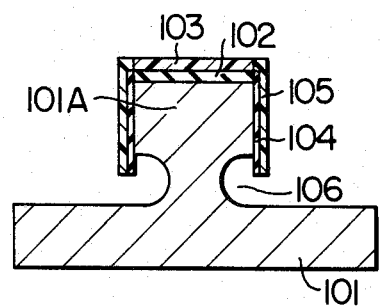

Then, as shown in FIG. 2c, the silicon oxide films 104 are removed and thereafter the silicon substrate 101 is isotropically etched by wet etching, for example to form groove portions 106 at the bottoms of the sides of the protrusion 101 A.

Next, as shown in FIG. 2d, n impurities such as phosphorous are diffused with high impurity concentration from the vapor phase thereby to form n+ regions 107.

Then, as shown in FIG. 2e, the groove portions 106 are selectively oxidized by using the silicon nitride films 103 and 105 as a mask. Then, silicon oxide films 108 are formed to extend laterally from the grooves so that the adjacent oxide films thus laterally extended are connected with each other at the bottom of the protrusion 101 A with the width in one direction being narrowed, and thus the oxide film is formed at the entire bottom of the protrusion. Then, the impurities of the n+ regions 107 are simultaneously diffused to form an n+ region at the entire bottom of the protrusion 101 A over the oxide film 108.

Figure 2F:
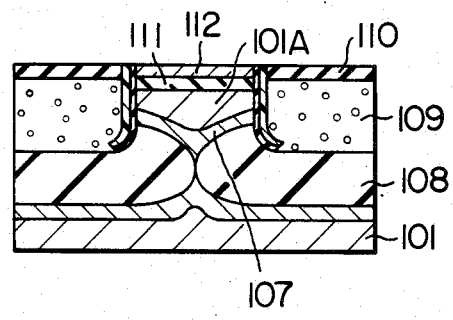

Next, as shown in FIG. 2f, an insulating film such as a polycrystalline silicon film 109 is deposited on the entire resultant surface by a low-pressure CVD method and the surface so formed is smoothed by the etch-back method. Thus, the polycrystalline silicon films 109 are buried at the sides of the protrusion 101 A. Thereafter oxide films 110 are formed on the polycrystalline silicon films 109. Next, the silicon nitride film 103 and the silicon oxide film 102 over the protrusion 101 A are removed, and thereafter a p type base region 111 and an n+ type emitter region 112 are formed by the conventional technique so as to complete an npn bipolar transistor. Incidentally, the n+ region 107 acts as a buried collector region.

Figure 3A:
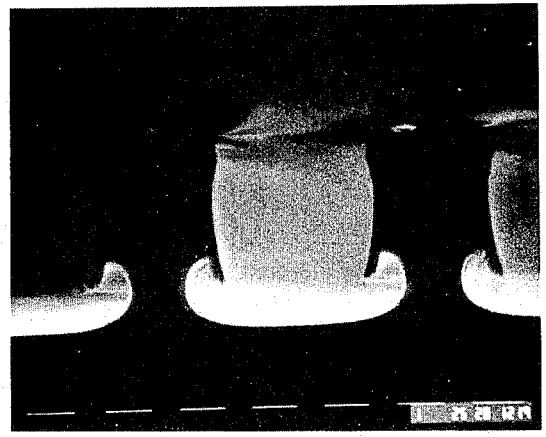
FIGS. 3a to 3b show sectional photographs of the steps employed in fabricating one embodiment of this invention.
Figure 3B:
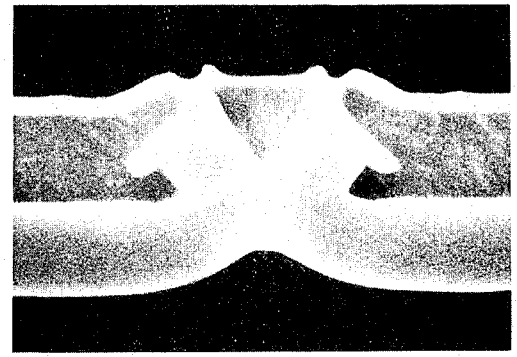

FIGS. 3a and 3b show sectional photographs of the resultant device fabricated according to the steps of one embodiment of this invention as mentioned above. FIG. 3a shows a sectional photograph at the step of forming grooves at the bottoms of the sides of a protrusion which has been explained referring to FIG. 2c. The height of the protrusion is about 3 μm. FIG. 3b shows a sectional photograph at the step of burying polycrystalline silicon films at the sides of the protrusion after forming an oxide film at the bottom of the protrusion, and oxidizing the polycrystalline silicon film surfaces which has been explained referring to FIG. 2f. Incidentally, the thickness of the oxide film 108 is about 2 μm.

In the embodiment described above in detail, in order to completely isolate electrically by an oxide film, the oxide film is formed at the entire bottom of the protrusion, but a part of the bottom of the protrusion can be connected with the substrate.

Although there has been explained the case where insulating films are buried at the sides of the protrusion in order to smooth the resultant surface, the protrusion may be employed as it is.

Further, although there has been described the case where polycrystalline silicon films are buried at the sides of the protrusion by the CVD method, CVD oxide films may be buried.

Moreover, in order to prevent the lift-off of the silicon nitride films on the sides of the protrusion when selective oxidation is performed to form the oxide film on the bottom of the protrusion by using the silicon nitride film as a mask, an insulating film such as a CVD SiO$_2$ film being 1000–2000 Å thick may be formed prior to the formation of the above oxide film, and thereafter the selective oxidation may be carried out to form the oxide film on the bottom of the protrusion by using the silicon nitride film as a mask.

Furthermore, although there has been described the case where a bipolar transistor is formed in the protrusion, other semiconductor devices or components such as a MOS transistor may be formed.

In accordance with this invention, device regions, each of which is isolated at its bottom or its bottom and sides by an insulating film, are formed in a semiconductor substrate, and a heavily doped buried layer can be also formed on the bottom of each of the device regions by a diffusion process. And, the device regions and heavily doped buried layers are not required to be formed by an epitaxial vapor growth method but can be formed in the same semiconductor substrate. Thus, this invention is advantageous in that it permits a semiconductor device with low parasitic capacitance and resistance to be made with low cost and hence this invention is of very high industrial value.

We claim:

1. A method of fabricating a semiconductor device comprising the steps of
   (a) forming a first oxidation-resistive film on a selected portion of the surface of a semiconductor substrate;
   (b) etching away the portion of said substrate not covered by said first oxidation-resistive film to form a semiconductor substrate having a base portion and a vertically protruding portion extending therefrom, said vertically protruding portion having a side surface and an upper surface covered by said first oxidation-resistive film;
   (c) forming a second oxidation-resistive film on the side surface of said protruding portion of said semiconductor substrate;
   (d) etching a groove in the side surface of said protruding portion adjacent the base portion of said semiconductor substrate;
   (e) diffusing impurities having a high impurity concentration into the surface of said groove and base portion of said substrate to form a high impurity-concentration diffusion region;
   (f) heat treating said semiconductor substrate in an oxidizing atmosphere to form an oxide film in said groove by using said first and second oxidation resistive films as a mask, said oxide film extending horizontally and transversely with respect to said diffusion region so that said oxide film substantially occupies the region interfacing said protruding and base portions of said substrate inclusive of said groove, whereby said heat treatment develops an increased high impurity-concentration diffusion region continuously extending above and below said oxide film; and
   (g) forming a semiconductor component in the protruding portion of said substrate.

2. A method of fabricating a semiconductor device comprising the steps of
   (a) forming a first oxidation-resistive film on a selected portion of the surface of a semiconductor substrate;
   (b) etching away the portion of said substrate not covered by said first oxidation-resistive film to form a semiconductor substrate having a base portion and a vertically protruding portion extending therefrom, said vertically protruding portion having a side surface and an upper surface covered by said first oxidation-resistive film;
   (c) forming a second oxidation-resistive film on the side surface of said protruding portion of said semiconductor substrate;
   (d) etching a groove in the side surface of said protruding portion adjacent the base portion of said semiconductor substrate;
   (e) diffusing impurities having a high impurity concentration into the surface of said groove and base portion of said substrate to form a high impurity-concentration diffusion region;

(f) heat treating said semiconductor substrate in an oxidizing atmosphere to form an oxide film in said groove by using said first and second oxidation-resistive films as a mask, said oxide film extending transversely with respect to said diffusion region so that said oxide film is formed in the entire area interfacing said protruding and base portions of said substrate and also forms a high impurity concentration diffusion region on said oxide film and under the entire traverse area of said protruding portion;

burying an insulating film along the surface of said protruding portion; and (g) forming a semiconductor component in the protruding portion of said substrate.

3. A method according to claim 1, wherein step (c) comprises forming said oxidation-resistive film on the entire surface of said semiconductor substrate followed by the anisotropic etching thereof.

4. A method according to claim 1, wherein step (f) includes forming an insulating film over said second oxidation-resistive film prior to subjecting said substrate to said heat treatment.

5. A method according to claim 1, wherein the semiconductor component formed in step (g) is a bipolar transistor having a buried collector region formed of said increased high impurity-concentration diffusion region.

6. A method according to claim 2, wherein an oxide film is formed on the entire area at the interface between said protruding and base portions of said semiconductor substrate.

7. A method according to claim 2, wherein step (c) comprises forming said oxidation-resistive film on the entire surface of said semiconductor substrate followed by the anisotropic etching thereof.

8. A method according to claim 2, wherein step (f) includes forming an insulating film over said second oxidation-resistive film prior to subjecting said substrate to said heat treatment.

9. A method according to claim 2, wherein the semiconductor component formed in step (g) is a bipolar transistor having a buried collector region formed of said increased high impurity-concentration diffusion region.

10. A method according to claim 2, wherein the first insulating film is a CVD Poly-Si film.

11. A method according to claim 2, wherein the first insulating film is a CVD $SiO_2$ film.

12. A method of fabricating a semiconductor device comprising the steps of (a) forming a first oxidation-resistive film on a selected portion of the surface of a semiconductor substrate;

(b) etching away the portion of said substrate not covered by said first oxidation-resistive film to form a semiconductor substrate having a base portion and a vertically protruding portion extending therefrom, said vertically protruding portion having a side surface and an upper surface covered by said first oxidation-resistive film;

(c) forming a second oxidation-resistive film on the side surface of said protruding portion of said semiconductor substrate;

(d) etching a groove in the side surface of said protruding portion adjacent the base portion of said semiconductor substrate;

(e) diffusing impurities having a high impurity concentration into the surface of said groove and base portion of said substrate to form a high impurity-concentration diffusion region;

(f) heat treating said semiconductor substrate in an oxidizing atmosphere to form an oxide film in said groove by using said first and second oxidation-resistive films as a mask, said oxide film extending transversely with respect to said diffusion region so that said oxide film is formed on the entire area interfacing said protruding and base portions of said substrate and also forms a high impurity concentration diffusion region on said oxide film and under the entire transverse area of said protruding portion; and (g) forming a bipolar transistor having a buried collector region, said buried collector region comprising said diffusion region.

* * * * *

UNITED STATES PATENT AND TRADEMARK OFFICE
CERTIFICATE OF CORRECTION

PATENT NO. : 4,615,746
DATED : October 7, 1986
INVENTOR(S) : Kenji KAWAKITA ET AL.

It is certified that error appears in the above-identified patent and that said Letters Patent is hereby corrected as shown below:

On the Title Page:

Between lines "[76]" and "[21]" please insert the assignee as follows:

-- [73] Assignee: Matsushita Electric Industrial Co., Ltd., Osaka, Japan --.

Signed and Sealed this

Eleventh Day of August, 1987

*Attest:*

DONALD J. QUIGG

*Attesting Officer*  *Commissioner of Patents and Trademarks*